(12) United States Patent
Tokunaga et al.

(10) Patent No.: US 9,557,379 B2
(45) Date of Patent: Jan. 31, 2017

(54) SEMICONDUCTOR INTEGRATED CIRCUIT

(71) Applicant: Kabushiki Kaisha Toshiba, Minato-ku, Tokyo (JP)

(72) Inventors: Chikako Tokunaga, Yokohama Kanagawa (JP); Kenichi Anzou, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/943,168

(22) Filed: Nov. 17, 2015

(65) Prior Publication Data
US 2016/0216331 A1 Jul. 28, 2016

(30) Foreign Application Priority Data

Jan. 22, 2015 (JP) ................................. 2015-010468

(51) Int. Cl.
G01R 31/28 (2006.01)
G01R 31/317 (2006.01)
G01R 31/3177 (2006.01)

(52) U.S. Cl.
CPC ..... *G01R 31/31724* (2013.01); *G01R 31/3177* (2013.01)

(58) Field of Classification Search
CPC ................. G11C 29/44; G11C 29/0405; G11C 2029/3602; G11C 29/12; G11C 29/4401; G11C 29/76
See application file for complete search history.

(56) References Cited

U.S. PATENT DOCUMENTS

| 6,343,366 | B1* | 1/2002 | Okitaka ................. G11C 29/44 714/719 |
| 6,374,378 | B1 | 4/2002 | Takano et al. |
| 6,536,005 | B1 | 3/2003 | Augarten |
| 6,668,348 | B1* | 12/2003 | Nakamura ......... G01R 31/3187 365/201 |
| 2006/0268633 | A1 | 11/2006 | Kurozumi et al. |
| 2008/0022176 | A1* | 1/2008 | Anzou .................... G11C 29/16 714/733 |
| 2009/0158087 | A1 | 6/2009 | Maeno et al. |
| 2009/0172483 | A1 | 7/2009 | Anzou et al. |
| 2010/0125766 | A1 | 5/2010 | Anzou et al. |
| 2010/0211836 | A1* | 8/2010 | Kodama ................. G06F 11/27 714/721 |

\* cited by examiner

*Primary Examiner* — David Ton
(74) *Attorney, Agent, or Firm* — White & Case LLP

(57) ABSTRACT

According to one embodiment, a semiconductor integrated circuit includes memories, comparison circuits, first registers and a BIST. The comparison circuits compare output values of the memories with expected values, respectively. The first registers store comparison result data in the comparison circuits, respectively. The BIST controls tests of the memories and generates the expected values. A relief data generator generates relief data indicating the presence of a defect of each of the memories and a failure position on the basis of the comparison result data stored in a second register in the BIST. A third registers store the relief data and are smaller in number than the memories. A judgment circuit outputs a relief impossible signal when the total number of the relief data is greater the number of the third registers.

12 Claims, 6 Drawing Sheets

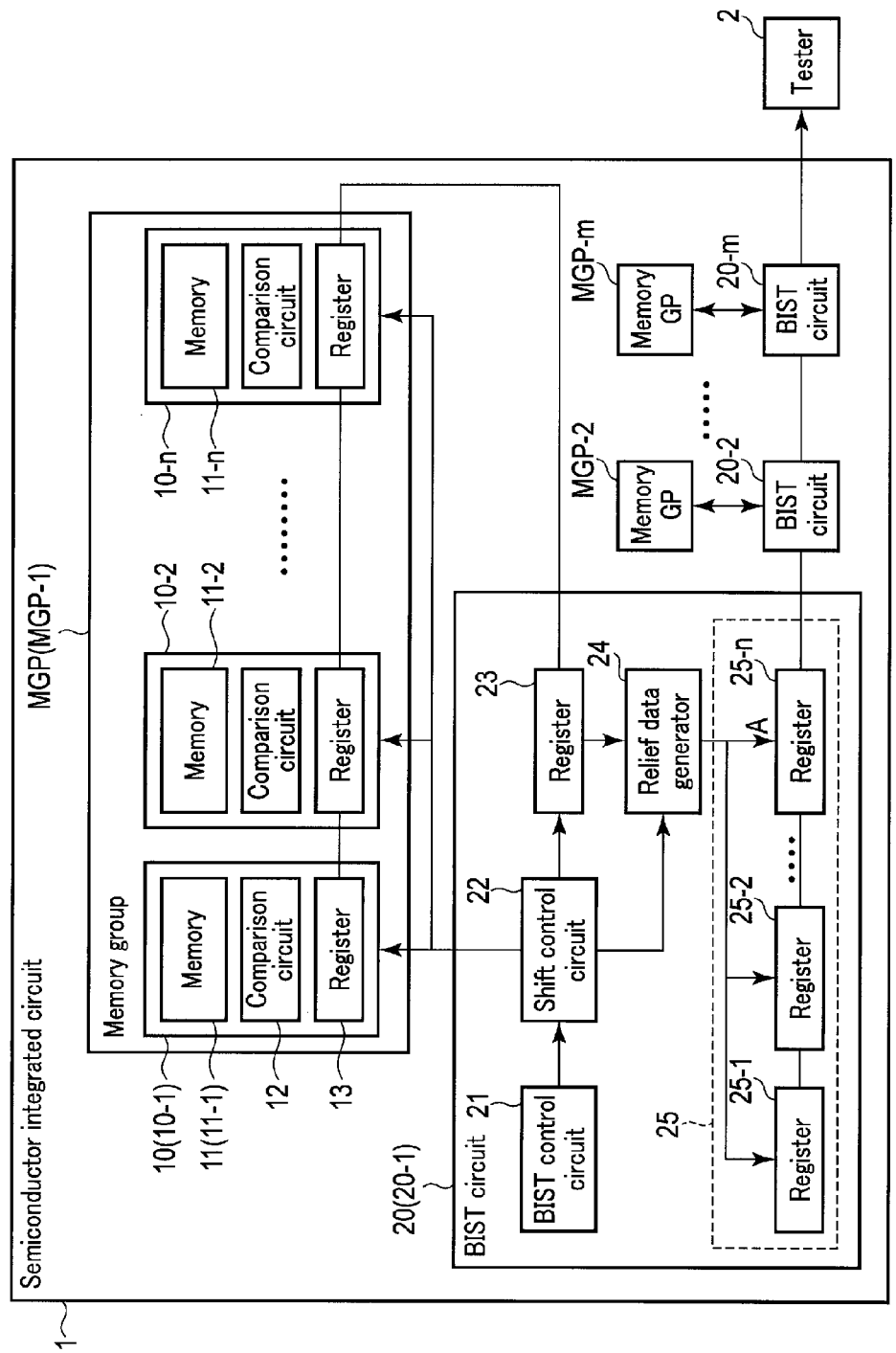
F I G. 1

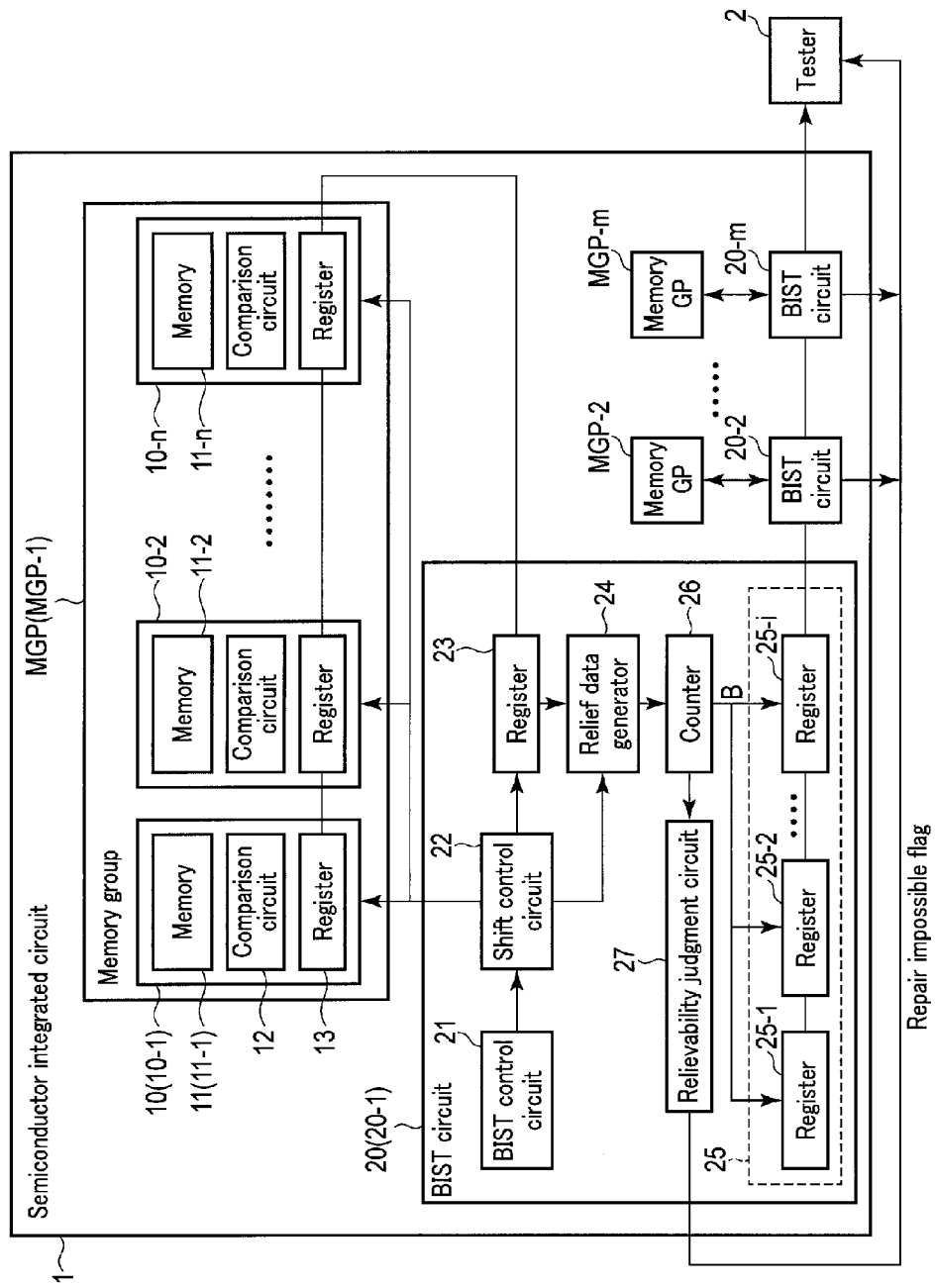
F I G. 4

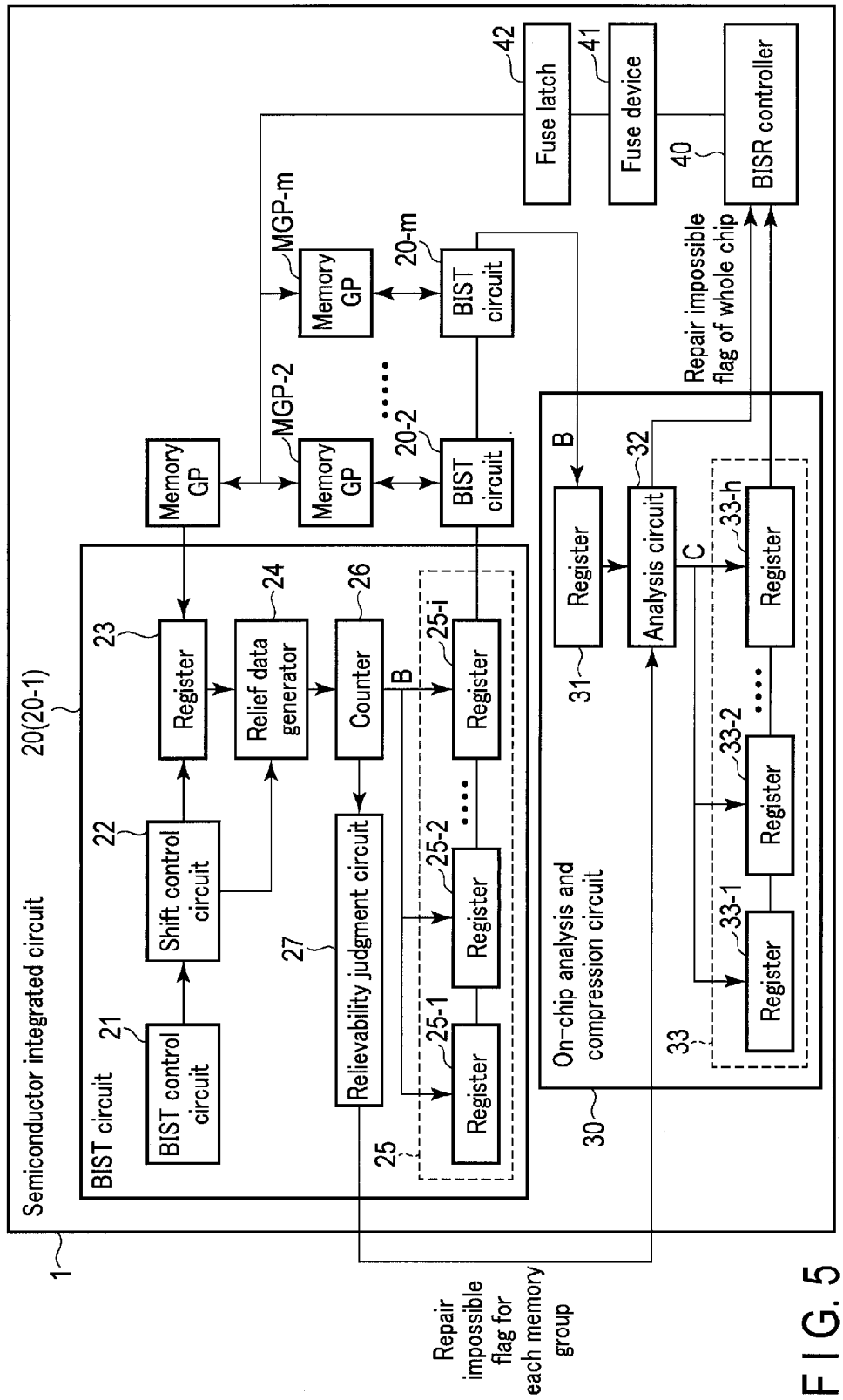
F I G. 5

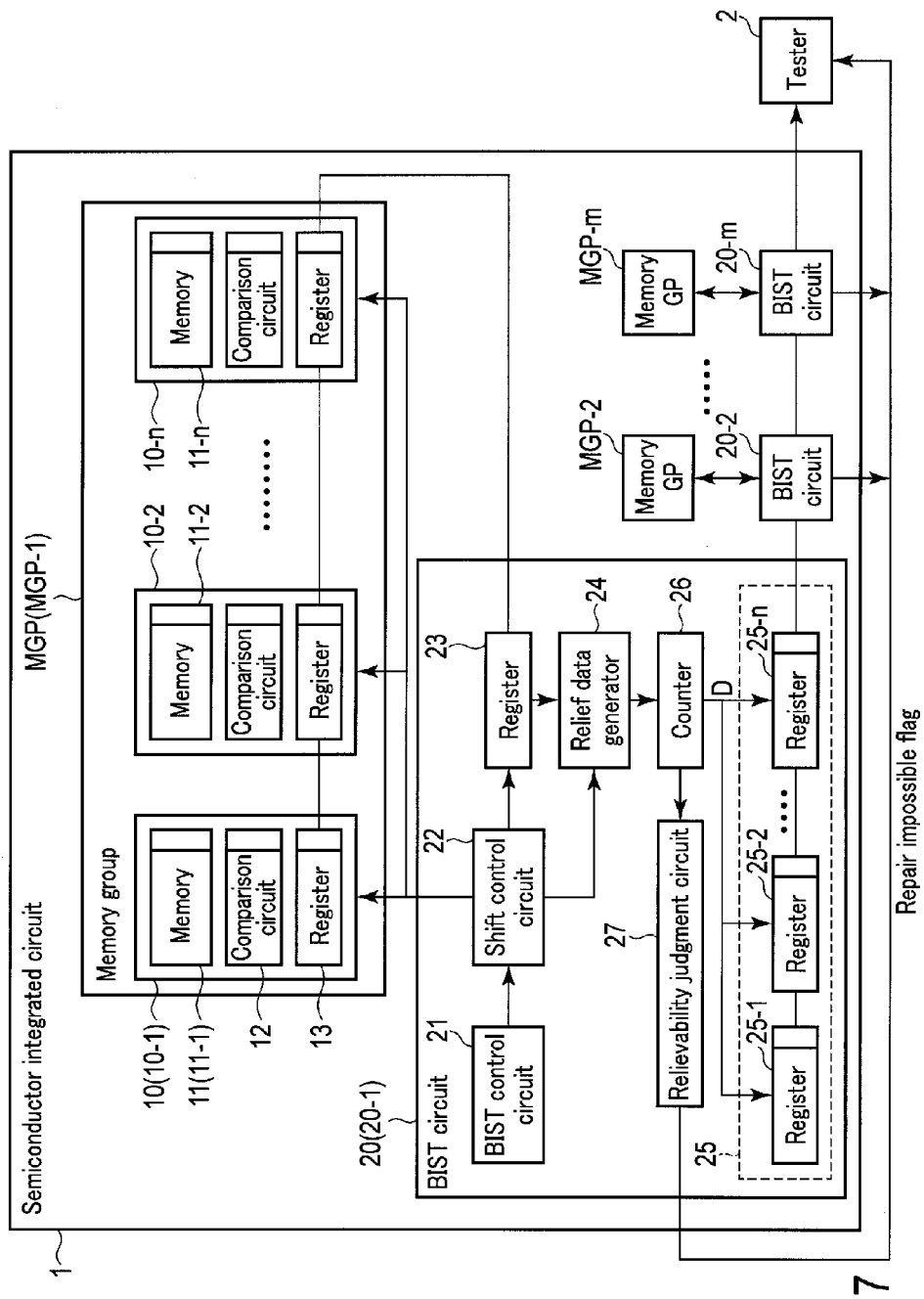
F I G. 7

SEMICONDUCTOR INTEGRATED CIRCUIT

CROSS-REFERENCE TO RELATED APPLICATIONS

This application is based upon and claims the benefit of priority from the Japanese Patent Application No. 2015-010468, filed Jan. 22, 2015, the entire contents of which are incorporated herein by reference.

FIELD

Embodiments described herein relate generally to a semiconductor integrated circuit with a built-in self-test circuit for memories.

BACKGROUND

There is known a method of building a self-test circuit for memories in a semiconductor integrated circuit and detecting a failure in a manufacturing test. This built-in self-test circuit is called a built-in self test (BIST) circuit. A built-in redundancy allocation (BIRA) circuit is known as a built-in redundant relief circuit which is used together with the BIST circuit and which performs analysis and redundant allocation on-chip.

In a semiconductor integrated circuit on which both the BIST circuit and the BIRA circuit are mounted, the BIRA circuit analyzes and processes the result of a comparison between a memory output and an expected value, and generates relief data. This relief data is then output to an external tester from the BIRA circuit. Such a semiconductor integrated circuit increases in circuit scale for the BIRA circuit mounted thereon.

Meanwhile, there has been suggested a semiconductor integrated circuit on which the BIRA circuit is not mounted and the BIST circuit is only mounted. This semiconductor integrated circuit can decrease a circuit scale because the BIRA circuit can be eliminated. However, in such a semiconductor integrated circuit, uncompressed data regarding the result of a comparison between a memory output and an expected value is serially output to a tester, and analyzed and processed in the tester. That is, a data row output by the semiconductor integrated circuit on which the BIRA circuit is not mounted is longer than a data row output by the BIRA circuit, and the number of comparisons with the expected value is greater. Thus, the test time of a memory increases.

BRIEF DESCRIPTION OF THE DRAWING

FIG. 1 is a block diagram of a semiconductor integrated circuit according to a first embodiment;

FIG. 4 is a block diagram of a semiconductor integrated circuit according to a second embodiment;

FIG. 5 is a block diagram of a semiconductor integrated circuit according to a third embodiment;

FIG. 7 is a block diagram of a semiconductor integrated circuit according to a fifth embodiment.

DETAILED DESCRIPTION

Figure 2:
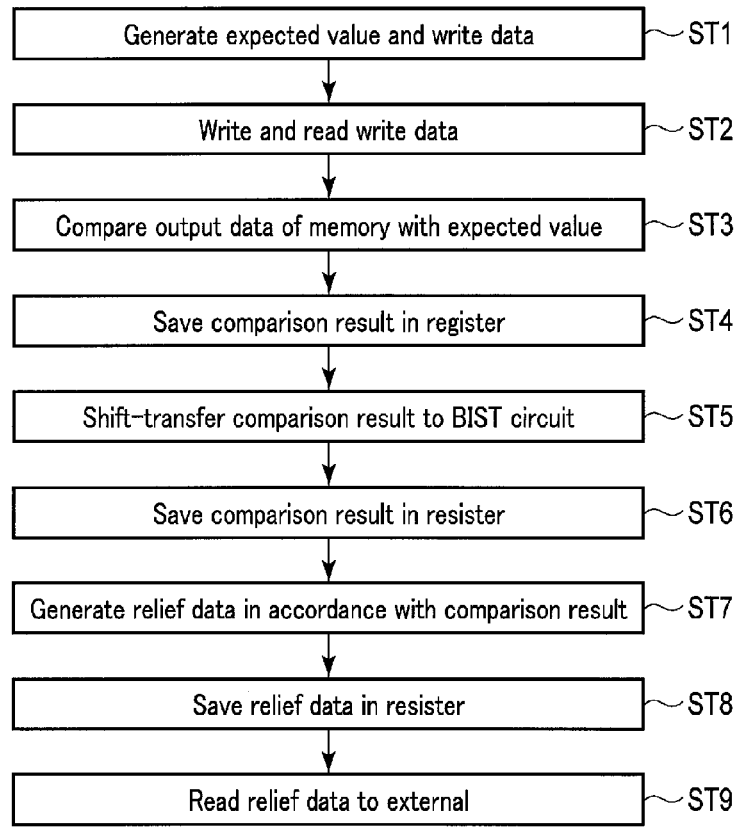
FIG. 2 is a flowchart of a memory test in the semiconductor integrated circuit according to the first embodiment.

Hereinafter, embodiments will be described with reference to the drawings. In the following explanation, elements having the same functions and configurations are provided with the same reference numerals and repeated explanations are given when necessary.

In general, according to one embodiment, a semiconductor integrated circuit includes memories, comparison circuits, first registers and a BIST circuit. The comparison circuits are respectively provided to correspond to the memories and respectively compare output values of the respective memories with expected values. The first registers are respectively provided to correspond to the memories and respectively store comparison result data in the respective comparison circuits. The BIST circuit controls tests of the memories and generates the expected values. The BIST circuit includes a second register, a relief data generator, third registers and a first judgment circuit. The second register stores the comparison result data transferred from the first registers. The relief data generator generates first relief data indicating the presence or absence of a defect of each of the memories and a failure position on the basis of the comparison result data stored in the second register. The third registers store the first relief data and are smaller in number than the memories. The first judgment circuit outputs a relief impossible signal when the total number of the first relief data is greater the number of the third registers.

1 First Embodiment

In a semiconductor integrated circuit 1 according to the first embodiment, no BIRA circuit is mounted, and a BIST circuit has the function of the BIRA circuit.

1-1 Configuration

The configuration of the semiconductor integrated circuit 1 according to the first embodiment is described with reference to FIG. 1.

As shown in FIG. 1, the semiconductor integrated circuit 1 according to the first embodiment includes memory groups MGP (MGP-1, MGP-2, . . . , and MGP-m) and BIST circuits 20 (20-1, 20-2, . . . , and 20-*m*). The semiconductor integrated circuit 1 is connected to an external tester 2.

The memory groups MGP have memory collars 10 (10-1, 10-2, . . . , and 10-*n*). Each of the memory collars 10 includes a memory 11, a comparison circuit 12, and a register 13.

The memory 11 stores predetermined data with any bit width and any number of word, and test write and read operations are performed by the BIST circuit 20. The memories 11 may respectively store data with any bit width or may store data with the same bit width. The memories 11 have spare cells (not shown), and have a redundant relief function to relieve defective cells.

The comparison circuit 12 compares the output (memory output) of the memory 11 with an expected value output from the BIST circuit 20, and detects a defect in the memory output. Here, the memory output is compared with the expected value for each bit (IO unit) including columns. However, this comparison is not exclusively conducted for each bit, and may be conducted, for example, for each column.

The register 13 holds comparison result of the comparison circuit 12. The register 13 is provided to correspond to each of the memories 11. The register 13 has, for example, the same bit width as the maximum bit width of the memory 11.

The BIST circuit 20 is provided for each of the memory groups MGP having the memory collars 10, and the same number of the BIST circuits 20 as that of the memory groups MGP are provided. The BIST circuit 20 includes a BIST control circuit 21, a shift control circuit 22, a resister 23, a relief data generator 24, and resisters 25 (25-1, 25-2, . . . , and 25-n). The BIST circuit 20 is shared by n memory collars 10 (10-1, 10-2, . . . , and 10-n), and conducts a self test of each of the memories 11. The BIST circuits 20 are connected to one another in serial.

The BIST control circuit 21 controls the whole BIST circuit 20. For example, the BIST control circuit 21 controls the shift transfer of the shift control circuit 22. The BIST control circuit 21 controls the generation of data, addresses (row addresses and column addresses) and controls signals for the memory 11 of the memory collar 10 so that a necessary test can be conducted. The BIST control circuit 21 controls the generation of a memory selection signal for selecting the memory 11 which is targeted for a test among n memory collars 10.

The shift control circuit 22 controls so that the comparison result held in each of the registers 13 in the memory collars 10 belonging to the memory group MGP is shift-transferred between the registers 13. If all the comparison results in the memories 11 pass (no defects), the shift control circuit 22 may finish the test operation without performing the shift-transfer.

The resister 23 holds the comparison result which has been shift-transferred in each of the registers 13 in the memory groups MGP. The resister 23 has, for example, the same bit width as the maximum bit width of the memory 11.

The relief data generator 24 analyzes the memory defect on the basis of the comparison result, and processes the comparison result to generate relief data A when the data output from the memory can be relieved.

Each of the resister 25 (25-1, 25-2, . . . , and 25-n) stores the relief data A generated by the relief data generator 24. The same number of the resisters 25 as that of the memories 11 are provided, and each of the resisters 25 stores the relief data A of each of the memories 11. The relief data A is compressed data regarding the comparison result by the comparison circuit 12, and the bit width that can be held in the resister 25 may be smaller than the bit width that can be held in the registers 13.

The BIST circuit 20 is not limited to the circuit configuration that is shown, and has, for example, a data generating unit, an address generating unit, and a control signal generating unit, as in a general BIST circuit.

That is, the data generating unit of the BIST circuit 20 generates write data for testing and outputs the write data to n memories 11 so that tests necessary for n memories 11 can be conducted. The data generating unit of the BIST circuit 20 also generates output expected values for n memories 11 corresponding to write data, and then outputs the output expected values to the comparison circuit 12. The data generating unit generates the output expected value in accordance with the maximum bit width of the memories 11.

The address generating unit of the BIST circuit 20 is the destination of the write data generated by the data generating unit, and generates addresses (hereinafter referred to as "write addresses") of n memories 11 from which written data are read, and then outputs the write addresses to n memories 11.

The control signal generating unit of the BIST circuit 20 generates a control signal for performing write operations and read operations in n memories 11, and then outputs the control signal to n memories 11.

The tester 2 is an external device which controls input signals in the BIST circuit 20 and observes output signals and which reads the relief data A output from the semiconductor integrated circuit 1.

It is also possible for the memory collars 10 in the semiconductor integrated circuit 1 to be divided into the memory groups MGP but share one the BIST circuit 20.

1-2 Test Flow

A test flow of the memories of the semiconductor integrated circuit 1 according to the first embodiment is described with reference to FIG. 1 and FIG. 2. While the multiple memory groups MGP exist in the semiconductor integrated circuit 1, the test of one memory group MGP is focused on here.

First, the BIST circuit 20 generates an expected value and write data for each of the memories 11 (ST1). The expected value of the memory 11 has, for example, the maximum bit width of the memory 11.

Writing and reading of the write data in the memory 11 are then performed by the BIST control circuit 21 (ST2).

The comparison circuit 12 compares output data of the memory 11 with the expected value, for example, for each bit (ST3). In this instance, the comparison circuit 12 masks unnecessary bits of the expected value to select necessary bits alone, and compares the output data with the necessary bits of the expected value. The comparison circuit 12 also performs the quality determination of the memory 11 on the basis of the comparison result. For example, when "0" indicates that the memory is not defective and "1" indicates that the memory is defective, the comparison circuit 12 judges that the memory is "defective" if at least one "1" is included in the comparison result.

The comparison result by the comparison circuit 12 is held in the register 13 by the BIST control circuit 21 (ST4).

The above test operations from ST2 to ST4 are performed in all the memories 11 in the memory group MGP in parallel.

The shift control circuit 22 then transfers the comparison result held in the register 13 to the BIST circuit 20 while shifting and passing the comparison result between the memory collars 10-1, 10-2, . . . , and 10-n (ST5), and the shift control circuit 22 stores the comparison result in the resister 23 in the BIST circuit 20 (ST6).

The relief data generator 24 analyzes the comparison result stored in the resister 23, and processes the comparison result to generate relief data A when the data output from the memory can be relieved (ST7). The relief data A has, for example, an enable bit indicating the presence or absence of a defect and a bit indicating a failure position, and its data row (data length) is shorter than that of the comparison result held in the register 13.

The BIST control circuit 21 stores the relief data A in the resister 25 (ST8). Here, the relief data A in each of the memories 11 is stored in each of the resisters 25 corresponding to the memories 11.

The relief data A held in the resister 25 is then read from the semiconductor integrated circuit 1 to the external tester 2 by the BIST control circuit 21 (ST9). In this instance, the relief data A is serially transferred in the resisters 25 and read into the external tester 2 because the resisters 25 in the BIST circuits 20 are serially connected. The read relief data A will be used in the subsequent process in the tester 2.

Next, the relation of the test operations between the memory groups MGP is described with reference to FIG. 1 and FIG. 3.

Figure 3:
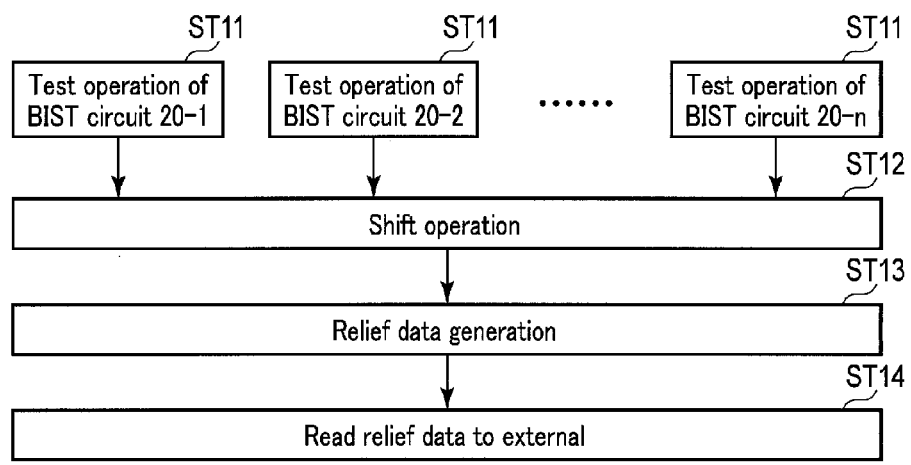
FIG. 3 is a flowchart of a test operation regarding memory groups in the semiconductor integrated circuit according to the first embodiment.

As shown in FIG. 1 and FIG. 3, a test operation for the memory 11 is performed in each of the BIST circuits 20 in the semiconductor integrated circuit 1 (ST11). This test operation is, for example, the process in steps ST1 to ST4 in FIG. 2.

After the test operations of all the BIST circuits 20 in the semiconductor integrated circuit 1 have been finished, the shift control circuits 22 then sequentially shift-transfers the comparison results stored in the registers 13 in the memory collars 10 belonging to the respective memory groups MGP to the resisters 23 in the BIST circuits 20 corresponding to the memory groups MGP for the respective the memories 11 (ST12).

After the shift operation of one register 13 belonging to each of the memory groups MGP in the semiconductor integrated circuit 1 has been finished, relief data A for the corresponding memory 11 is then generated in the relief data generator 24 in each of the BIST circuits 20, and stored in the resister 25 (ST13).

After the generation of relief data A for all the memories 11 belonging to the memory groups MGP has been finished in all the BIST circuits 20 in the semiconductor integrated circuit 1, the relief data A is then shift-transferred and read into the external tester 2 (ST14).

The shift operation (ST12) and the relief data generation (ST13) in FIG. 3 are not exclusively started at the same time after the operations have been completed in all the BIST circuits 20 in the semiconductor integrated circuit 1, and may be individually started in the BIST circuits 20.

1-3 Effects in the First Embodiment

According to the first embodiment described above, the BIRA circuit is not mounted on the semiconductor integrated circuit 1, and the BIST circuit 20 has the function of the BIRA circuit. That is, the BIST circuit 20 according to the first embodiment has the shift control circuit 22, the relief data generator 24, and the resisters 23 and 25. Thus, the result of a comparison between the memory output and the expected value is shift-transferred between the memory collars 10 by the shift control circuit 22 and held in the resister 23 of the BIST circuit 20. The data held in the resister 23 is then analyzed by the relief data generator 24, and when the data can be relieved, relief data A is generated. This relief data A is held in the resister 25, and read by the tester 2.

According to this first embodiment, the relief data A read by the tester 2 is data processed (compressed) by the relief data generator 24 in the BIST circuit 20. That is, the relief data A is not data corresponding to the full bit width of the memory 11, but is shorter than the data held in the register 13 in the memory collar 10 and is the same relief data (BIRA data) width+α (enable bit) in a conventional BIRA-mounted semiconductor integrated circuit. Therefore, the data row read by the tester 2 can be shorter, so that the consumption of the failed memories in the tester 2 can be suppressed. Accordingly, it is possible to suppress the scale of a relief analysis circuit, and reduce the test time of the memory 11.

The relief data A can be generated by the relief data generators 24 in all the BIST circuits 20 in parallel, so that the increase of the test time can be inhibited.

In the first embodiment, information (e.g., information regarding the bit width of the memory 11) in the BIST circuit 20 is used during the test operation, so that it is possible to suppress an overhead.

Moreover, in the first embodiment, the register 13 is provided in the memory collar 10 for each of the memories 11. Thus, the comparison result by the comparison circuit 12 can be temporarily held in the register 13. Therefore, the shift control circuit 22, the relief data generator 24, and the resisters 23 and 25 provided in the BIST circuit 20 may operate at low speed, so that it is possible to suppress a design load.

2 Second Embodiment

In the second embodiment, when the upper limit of the number of fuses in the whole semiconductor integrated circuit 1 is set, the number of the resisters 25 to store relief data for each of the BIST circuits 20 is adjusted. The differences between the second embodiment and the first embodiment are mainly described next.

2-1 Configuration

The configuration of the semiconductor integrated circuit 1 according to the second embodiment is described with reference to FIG. 4.

As shown in FIG. 4, the configuration according to the second embodiment is different from that according to the first embodiment in that the BIST circuit 20 additionally has a counter 26 and a relievability judgment circuit 27 and in that the number of the resisters 25 (25-1, 25-2, . . . , and 25-$i$: $i<n$) to store relief data B in the BIST circuit 20 is smaller than the number of the memories 11.

The counter 26 counts the number of defective memories (the number of memories that need relief) for which the relief data B have been generated by the relief data generator 24. When the number of defective memories has become greater than the number of the resisters 25, the relievability judgment circuit 27 outputs a repair impossible flag (relief impossible signal) because of the shortage of the resisters 25 to store the relief data B. Information for identifying the memories 11 in the relief data B is attached to the relief data B stored in the resisters 25 in contrast to the relief data A according to the first embodiment.

2-2 Test Flow

A test flow of the memories of the semiconductor integrated circuit 1 according to the second embodiment is described with reference to FIG. 4.

In the second embodiment as well as in the first embodiment, the comparison result by the comparison circuit 12 is shift-transferred to the BIST circuit 20. Relief data B to which identification information for the memory 11 is provided is generated in the relief data generator 24 of the BIST circuit 20. In this instance, the number of defective memories for which the relief data B have been generated is counted by the counter 26. The relievability judgment circuit 27 outputs the repair impossible flag to the tester 2 when the number of defective memories (the total number of the relief data B generated by the relief data generator 24) has become greater than the number of the resisters 25. The tester 2 then judges to finish the test.

If the repair impossible flag is output from at least one of the BIST circuits 20 in the semiconductor integrated circuit 1, the tester 2 judges that the chip is defective. It is not necessary to read the relief data B into the tester 2 for the semiconductor integrated circuit 1 to which the repair impossible flag is output.

2-3 Effects in the Second Embodiment

According to the second embodiment described above, it is possible to obtain not only the advantageous effects similar to the advantageous effects according to the first embodiment but also the following advantageous effects.

In the second embodiment, when the upper limit of the number of fuse data is set, the number of the resisters 25 to store relief data for each of the BIST circuits 20 is smaller than the number of the memories 11. Thus, the increase of the circuit scale can be inhibited.

Moreover, in the second embodiment, the relievability judgment circuit 27 outputs the repair impossible flag when the number of defective memories has become greater than the number of the resisters 25, and the test is finished accordingly. It is therefore possible to inhibit the increase of the test time.

3 Third Embodiment

In the third embodiment, an on-chip analysis and compression circuit is not connected to the external tester but is mounted on the semiconductor integrated circuit 1 so that the on-chip analysis and compression circuit can be connected to a built-in self repair (BISR) circuit. The differences between the third embodiment and the first and second embodiments are mainly described.

3-1 Configuration

The configuration of the semiconductor integrated circuit 1 according to the third embodiment is described with reference to FIG. 5.

As shown in FIG. 5, the semiconductor integrated circuit 1 has the function of the tester in the third embodiment. That is, an on-chip analysis and compression circuit 30 is mounted on the semiconductor integrated circuit 1, and a BISR controller 40 is connected to the on-chip analysis and compression circuit 30.

The on-chip analysis and compression circuit 30 has an analysis circuit (judgment circuit) 32, and registers 31 and 33 (33-1, 33-2, . . . , and 33-h). The on-chip analysis and compression circuit 30 is shared by the BIST circuits 20.

The register 31 stores relief data (including identification information for the memories 11) serially transferred between the BIST circuits 20. The bit width that can be held by the register 31 may be smaller than the bit width that can be held by the register 13.

The analysis circuit 32 converts the identification information for each of the memories 11 in the relief data B held in the register 31 to chip-level identification information, and generates relief data C. That is, the relief data C includes chip-level identification information for each of the memories 11. The chip-level identification information shows information indicating which memory group MGP the memory 11 belongs to. The analysis circuit 32 outputs a repair impossible flag (relief impossible signal) when the total number of effective relief data C is greater than the number of the relievable memories 11.

The registers 33 store the relief data C. The number of the registers 33 is the same as the maximum number of relievable memories in the semiconductor integrated circuit 1. The bit width that can be held by the register 33 may be smaller than the bit width that can be held by the register 13.

The BISR controller 40 uses the relief data C to control the data writing into a fuse device 41 to relive the defective memories.

The fuse device 41 programs the relief data C generated by the analysis circuit 32. The fuse device 41 may use, for example, an electric fuse that can be programmed only once. Other programmable devices such as a flash memory may be used instead of the fuse device 41.

A fuse latch 42 transfers the data programmed in the fuse device 41 to the memories 11. This data converts addresses for accessing the memories 11 to addresses in a spare memory (redundant part). Thus, the memories 11 can be in an after-relief state, that is, in a state in which no failure bits apparently exist by the use of spare cells.

3-2 Test Flow

A test flow of the memories of the semiconductor integrated circuit 1 according to the third embodiment is described with reference to FIG. 5.

In the third embodiment as well as in the second embodiment, the relief data B is generated in the relief data generator 24 of the BIST circuit 20. In this instance, the number of defective memories for which the relief data B have been generated is counted by the counter 26. The relievability judgment circuit 27 outputs the repair impossible flag to the on-chip analysis and compression circuit 30 when the number of defective memories has become greater than the number of the resisters 25.

In the on-chip analysis and compression circuit 30, the relief data B serially transferred between the BIST circuits 20 is stored in the register 31. The analysis circuit 32 converts the identification information for each of the memories 11 in the relief data B to the chip-level identification information, and generates relief data C. This relief data C is stored in the register 33.

The analysis circuit 32 outputs a chip-level repair impossible flag (relief impossible signal) to the BISR controller 40 when the total number of effective relief data C is greater than the number of the relievable memories 11 in the whole semiconductor integrated circuit 1.

The relief data C stored in the register 33 is read by the BISR controller 40. The BISR controller 40 controls the writing into the fuse device 41 on the basis of the relief data C. The data written in the fuse device 41 is transferred to the memories 11 by the fuse latch 42.

3-3 Effects in the Third Embodiment

According to the third embodiment described above, it is possible to obtain not only the advantageous effects similar to the advantageous effects according to the first and second embodiments but also the following advantageous effects.

In the third embodiment, the on-chip analysis and compression circuit 30 is mounted on the semiconductor integrated circuit 1. Thus, it is not necessary to read the relief data to the outside, and the defective memories can be repaired in the semiconductor integrated circuit 1 by the BISR technique.

The third embodiment has been applied to the second embodiment but is also applicable to the first embodiment.

4 Fourth Embodiment

The fourth embodiment shows an example of how the memories 11 different in bit width are tested. The differences between the fourth embodiment and the first and second embodiments are mainly described.

4-1 Test Flow

Figure 6:
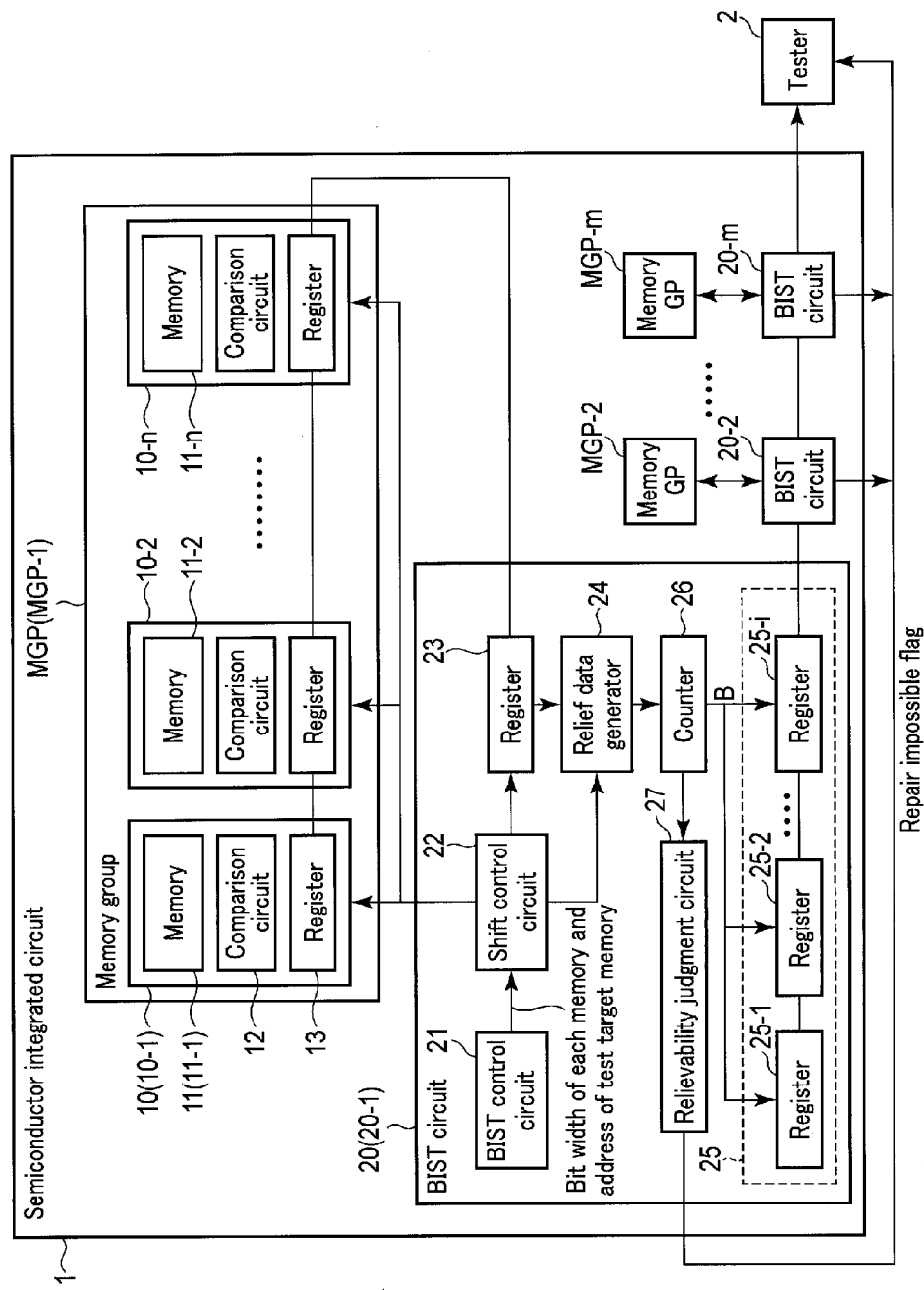
FIG. 6 is a block diagram of a semiconductor integrated circuit according to a fourth embodiment.

A test flow of the memories of the semiconductor integrated circuit 1 according to the fourth embodiment is described with reference to FIG. 6.

In the fourth embodiment, the BIST control circuit 21 has the bit width of each of the memories 11, and index information (address information) regarding the memory 11 targeted for the test. The BIST control circuit 21 provides the shift control circuit 22 with the bit width of each of the memories 11, and index information regarding the memory 11 targeted for the test at present. To shift-transfer the comparison result of the memory 11 targeted for the test, the shift control circuit 22 then recognizes the necessary bit width for each of the memories 11 to perform a shift operation for a necessary number of shifts for the memory 11.

The resister 23 has the maximum bit width of the memory 11. Thus, when the bit width of the memory 11 targeted for the test is smaller than the maximum bit width, the data held in the resister 23 can be treated as data which has the maximum bit width and which has no failure if the most significant bit (enable bit) indicating information regarding the presence or absence of a defect is set to "0" (no memory defect). As a result, the contents of each of the registers 13 of the memories 11 different in bit width can be sequentially shifted to perform a relief analysis, and there is another advantageous effect that a relief analysis can be performed only for some of the memories 11.

4-2 Effects in the Fourth Embodiment

According to the fourth embodiment described above, it is possible to obtain not only the advantageous effects similar to the advantageous effects according to the first and second embodiments but also the following advantageous effects.

In the fourth embodiment, the BIST control circuit 21 stores the bit width of each of the memories 11 and the address of the memory 11 targeted for the test, performs a shift operation for the necessary bit width alone in accordance with each of the memories 11, and sequentially inputs the bit width and the address to the relief data generator 24. As a result, it is possible to sequentially shift the contents of each of the registers 13 of the memories 11 different in bit width to perform a relief analysis. It is also possible to test any one of the memories 11 different in bit width.

The fourth embodiment has been applied to the second embodiment but is also applicable to the first embodiment. It is also possible to mount the on-chip analysis and compression circuit 30 according to the third embodiment.

5 Fifth Embodiment

The fifth embodiment shows an example of the use of pass/fail information in a spare bit. The differences between the fifth embodiment and the first and second embodiments are mainly described.

5-1 Test Flow

A test flow of the memories of the semiconductor integrated circuit 1 according to the fifth embodiment is described with reference to FIG. 7.

In the fifth embodiment as well as in each embodiment, the comparison circuit 12 compares output data of the memory 11 with the expected value for each bit, and this comparison result is stored in the register 13. Here, in the fifth embodiment, data regarding the comparison result includes defect information (pass/fail information) in the spare bit, and data regarding the comparison result including defect information for this spare bit is stored in the register 13. The data regarding the comparison result including the defect information for the spare bit is serially transferred between the registers 13, and relief data D is generated in the relief data generator 24. This relief data D includes spare flag (pass/fail) information. Using this spare flag information, the relievability judgment circuit 27 judges whether the target memory 11 can be relieved. That is, when a defect is detected in one bit of the memory output, the memory 11 can be relieved and relief data can be created if the spare bit has no defect. In contrast, when the spare bit also has a defect, relief is impossible, and the relievability judgment circuit 27 outputs a relief impossible signal.

5-2 Effects in the Fifth Embodiment

According to the fifth embodiment described above, it is possible to obtain not only the advantageous effects similar to the advantageous effects according to the first and second embodiments but also the following advantageous effects.

In the fifth embodiment, the defect information in the spare bit has been obtained at the test stage before the relief of the defective memories. Thus, no failure is found in the spare bit after the relief of the defective memories, so that the memories can be efficiently relieved.

The fifth embodiment has been applied to the second embodiment but is also applicable to the first embodiment. It is also possible to mount the on-chip analysis and compression circuit 30 according to the third embodiment on the semiconductor integrated circuit 1 according to the fifth embodiment, and combine the fifth embodiment with the fourth embodiment.

According to the first to fifth embodiments, it is possible to provide a semiconductor integrated circuit in which the scale of a relief analysis circuit can be suppressed and in which the test time of a memory can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   memories;
   comparison circuits which are respectively provided to correspond to the memories and which respectively compare output values of the respective memories with expected values;
   first registers which are respectively provided to correspond to the memories and which respectively store comparison result data in the respective comparison circuits; and
   a built-in self test (BIST) circuit which controls tests of the memories and which generates the expected values,
   wherein the BIST circuit comprises
   a second register which stores the comparison result data transferred from the first registers,
   a relief data generator which generates first relief data indicating the presence or absence of a defect of each of the memories and a failure position on the basis of the comparison result data stored in the second register, third registers which store the first relief data and which are smaller in number than the memories, and a first judgment circuit which outputs a relief impossible signal when the total number of the first relief data is greater the number of the third registers.

2. The semiconductor integrated circuit according to claim 1,
wherein the first relief data includes identification information for the memories for which the first relief data has been generated.

3. The semiconductor integrated circuit according to claim 2,
further comprising a second judgment circuit which converts the identification information for the memories in the first relief data into identification information for the semiconductor integrated circuit and generates second relief data including the identification information for the semiconductor integrated circuit.

4. The semiconductor integrated circuit according to claim 3,
wherein the second judgment circuit outputs a relief impossible signal when the total number of the second relief data is greater the number of the relievable memories in the whole semiconductor integrated circuit.

5. The semiconductor integrated circuit according to claim 3,
further comprising a built-in self repair circuit which uses the second relief data to relieve defective memories.

6. The semiconductor integrated circuit according to claim 3,
further comprising a fuse device in which the second relief data are programmed; and
a fuse latch which outputs the second relief data programmed in the fuse device to the memories.

7. The semiconductor integrated circuit according to claim 1,
wherein the first relief data has a data row which is shorter than that of the comparison result data stored in the first register.

8. The semiconductor integrated circuit according to claim 1,
further comprising a counter which counts the number of the memories for which the first relief data have been generated.

9. The semiconductor integrated circuit according to claim 1,
wherein more than one BIST circuit are provided,
the BIST circuits are serially connected to one another, and
the first relief data are serially transferred to the BIST circuits and then output to the outside.

10. The semiconductor integrated circuit according to claim 1,
further comprising a shift control circuit which is provided in the BIST circuit and which uses a bit width of each of the memories and address information regarding the memory targeted for a test to shift-transfer the comparison result data in the memory targeted for the test between the first registers.

11. The semiconductor integrated circuit according to claim 1,
wherein the first registers respectively store the comparison result data including defect information in a spare bit, and
the first judgment circuit judges whether a defective memory is relievable on the basis of the defect information in the spare bit.

12. The semiconductor integrated circuit according to claim 11,
wherein the first judgment circuit outputs a relief impossible signal when the defect information in the spare bit indicates a defect.

* * * * *